United States Patent [19]

Pfiester

[11] Patent Number: 5,536,962
[45] Date of Patent: Jul. 16, 1996

[54] SEMICONDUCTOR DEVICE HAVING A BURIED CHANNEL TRANSISTOR

[75] Inventor: James R. Pfiester, Austin, Tex.

[73] Assignee: Motorola, Inc., Schaumburg, Ill.

[21] Appl. No.: 547,448

[22] Filed: Oct. 24, 1995

Related U.S. Application Data

[63] Continuation of Ser. No. 334,986, Nov. 7, 1994, abandoned.

[51] Int. Cl.$^6$ .......................... H01L 29/76; H01L 29/94; H01L 31/62; H01L 27/11
[52] U.S. Cl. .......................... 257/392; 257/391; 257/403; 257/903
[58] Field of Search .................................... 257/391, 392, 257/402, 403, 404, 407, 369, 903

[56] References Cited

U.S. PATENT DOCUMENTS 5,055,904  10/1991  Minami et al. ........................ 257/903

OTHER PUBLICATIONS

Parrillo et al., "A Fine–Line CMOS Technology that uses P$^+$–polysilicon/slicide gates for NMOS and PMOS devices", AT&T Bell Laboratories, 1984 IEDM, pp. 418–422.

Nakahara et al., "Relief of hot carrier constraint on submicron CMOS Devices by use of a buried channel structure", Semiconductor Device Engineering Lab., Toshiba Corp., 1985 IEDM, pp. 238–241.

Primary Examiner—Steven H. Loke
Attorney, Agent, or Firm—Jasper W. Dockrey

[57] ABSTRACT

A semiconductor device (10) includes first and second electrically coupled MOS transistors (16, 28) in which the current gain of the second MOS transistor (16) is greater than the current gain of the first MOS transistor (28). Higher carrier mobility is obtained in the second MOS transistor (16) relative to the first MOS transistor (28) by fabrication of the second MOS transistor (16) as a buried channel device. The first MOS transistor (28) includes a gate electrode (44) of the second conductivity type separated from a channel region (46) of the first conductivity type by a gate electric layer (48). The second MOS transistor (16) includes a gate electrode (40) of a first conductivity type overlying a substrate (11) also of the first conductivity type. A channel surface layer (60) of a second conductivity type resides in the substrate (11) and is separated from the gate electrode (40) by a gate dielectric layer (58). The second MOS transistor (16) is electrically coupled to the first MOS transistor (28) by a doped region (52) of the second conductivity type.

8 Claims, 2 Drawing Sheets

SEMICONDUCTOR DEVICE HAVING A BURIED CHANNEL TRANSISTOR

This is a continuation of application Ser. No. 08/334,986, filed Nov. 7, 1994 and now abandoned.

FIELD OF THE INVENTION

This invention relates in general to semiconductor devices, and more particularly, to a semiconductor device having a buried channel MOS transistor electrically coupled to a surface channel MOS transistor, wherein the paired transistors are characterized by a current-gain differential.

BACKGROUND OF THE INVENTION

In many VLSI integrated circuit devices there is a need to fabricate transistors that have different electrical performance characteristics. For example, static-random-access-memory (SRAM) cells suffer stability problems as the cell size is reduced. To function properly, the SRAM memory cell, when charged, must hold a voltage level, either high (logic 1) or low (logic 0). When reading data from the cell, the cell current generated as the pass transistor turns on must not flip the voltage level at the internal cell nodes. To stabilize the cell, the driver transistor is fabricated to have a higher current gain than the pass transistor. Usually, the current gain relationship is controlled by adjusting the width-to-length (W/L) ratio of the driver transistor relative to that of the pass transistor. The ratio of the W/L values of the two transistors is known as the cell ratio and is commonly specified to be at least 3.0 or larger.

The physical adjustment of the W/L ratio for a metal-oxide-semiconductor (MOS) transistor requires a dimension change in either the width or the length of the gate electrode. In a VLSI circuit, where component sizes are typically reduced as much as possible, a constraint is placed on the maximum dimension of both the width and the length of the gate electrodes used in the circuit. This constraint limits the ability of a circuit designer to affect a parameter, such as an SRAM cell ratio. The cell designer is not free to arbitrarily select large values for one dimension relative to the other dimension in order to achieve the desired W/L ratio.

Recognizing a need to control the performance characteristics of one MOS transistor relative to that of another by means other than changing physical dimensions of the gate, technologists have developed other methods to control transistor performance characteristics. In one method, the control of the current gain of an pass transistor relative to a driver transistor is achieved by changing the doping concentration in the source-drain region. The gain of the pass transistor is reduced by omitting the N+ source region when forming the pass transistor. While this method is effective in changing current gain, the alteration can result in lower cell currents and slower read-access times. In another method, the thickness of the gate dielectric is increased in one transistor relative to the other. For example, the thickness of the gate dielectric layer is made large in the pass transistor relative to the gate dielectric thickness in the driver transistor. The pass transistor having the thicker dielectric layer has a lower current gain than the driver transistor. While changing the dielectric thickness is effective in altering current gain, additional high-precision processing steps are necessary to obtain an exact dielectric thickness differential between the two transistors.

Although the techniques described above overcome the limitations inherent in adjusting the dimensions of a gate electrode in a VLSI circuit, still more exact control of the current-gain parameter is needed to meet the demands of ever smaller circuit designs. Furthermore, the prior art methods for increasing memory cell stability involve retarding the performance of the pass transistor. In achieving a desired current gain differential, the method used should not result in abnormal transistor performance, such as degraded performance, and must be readily manufacturable.

SUMMARY OF THE INVENTION

In practicing the present invention, there is provided a semiconductor device, which includes a surface channel MOS transistor electrically coupled to a buried channel MOS transistor. The higher carrier mobility of the buried channel device, relative to the surface channel device, provides a differential in current gain between the electrically coupled MOS transistors. The creation of electrically coupled MOS transistors having a current gain differential can be advantageously used in the fabrication of an SRAM memory device. By fabricating the pass transistor as a surface channel device and the driver transistor as a buried channel device, enhanced cell stability is realized through an increase in the beta ratio of the memory cell. In one embodiment, a substrate is provided of a first conductivity type and having a surface. A first MOS transistor includes a gate electrode of a second conductivity type. The first MOS transistor is characterized by a first current gain. A second MOS transistor includes a gate electrode of the first conductivity type overlying a channel surface layer also of the first conductivity type. The second MOS transistor is characterized by a second current gain, wherein the second current gain is greater than the first current gain.

Figure 1:
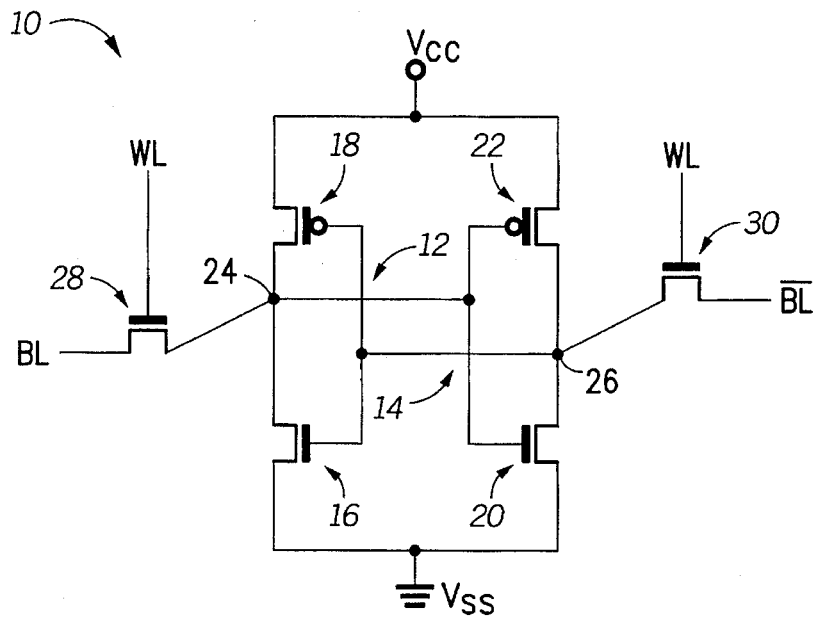
FIG. 1 is a schematic circuit diagram of a SRAM memory cell interconnected in accordance with the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

This invention provides a device structure in which two MOS transistors are electrically coupled, and wherein one of the two transistors has a higher current gain. The inventive structure obtains the differential gain relationship without utilizing a large amount of substrate surface area. Paired MOS transistors having a current gain differential can be advantageously employed in many different integrated circuit devices. For example, in SRAM devices, the pass transistors control bit-line pass to the driver transistors, but must not generate as much drive current as the driver transistors. Depending upon the particular configuration and sequence of photomasking layers, the device of the present invention can be fabricated in an integral part of a complete process further employing additional process steps to fabricate other MOS devices, such as a dynamic-random-access-memory (DRAM) device, a microprocessor device, a bipolar-complementary-MOS (Bi-CMOS) device, and the like.

Shown in FIG. 1 is schematic circuit diagram of an SRAM memory cell 10. Memory cell 10 includes two cross-coupled, CMOS inverters 12 and 14. CMOS inverter 12 includes a driver transistor 16 and a thin-film, load transistor 18. Similarly, CMOS inverter 14 includes a driver transistor 20 and a thin-film, load transistor 22. The inverters are cross-coupled at nodes 24 and 26. Pass transistors 28 and 30 are also coupled to the outputs of inverters 12 and 14 at nodes 24 and 26, respectively. Pass transistors 28 and 30 provide bit line pass to memory cell 10.

In a preferred embodiment, the driver transistors and the pass transistors are formed on a semiconductor substrate 11, and the thin-film load transistors are formed in thin-film layers overlying the driver and pass transistors. One embodiment of memory cell 10 illustrating the layout of the driver transistors and the pass transistors is shown in the plan view of FIG. 2. Wordlines 32 and 34 overlie active regions 36 and 38, respectively. A portion of wordline 32 overlying active region 36 forms the gate electrode of pass transistor 28. Similarly, a portion of wordline 34 overlying active region 38 forms the gate electrode of pass transistor 30. Driver transistors 16 and 20 are formed in active regions 36 and 38, respectively. A driver gate electrode 40 of driver transistor 16 contacts active region 38 at node 26 and overlies a portion of active region 36. Similarly, a driver gate electrode 42 of driver transistor 20 contacts active region 36 at node 24 and overlies a portion of active region 38. Those skilled in the art will appreciate that many different arrangements are possible for the layout of the active regions and the driver and pass transistors. While only one possible layout is described herein, the present invention contemplates different arrangements and geometric relationships between the various components.

Figure 2:
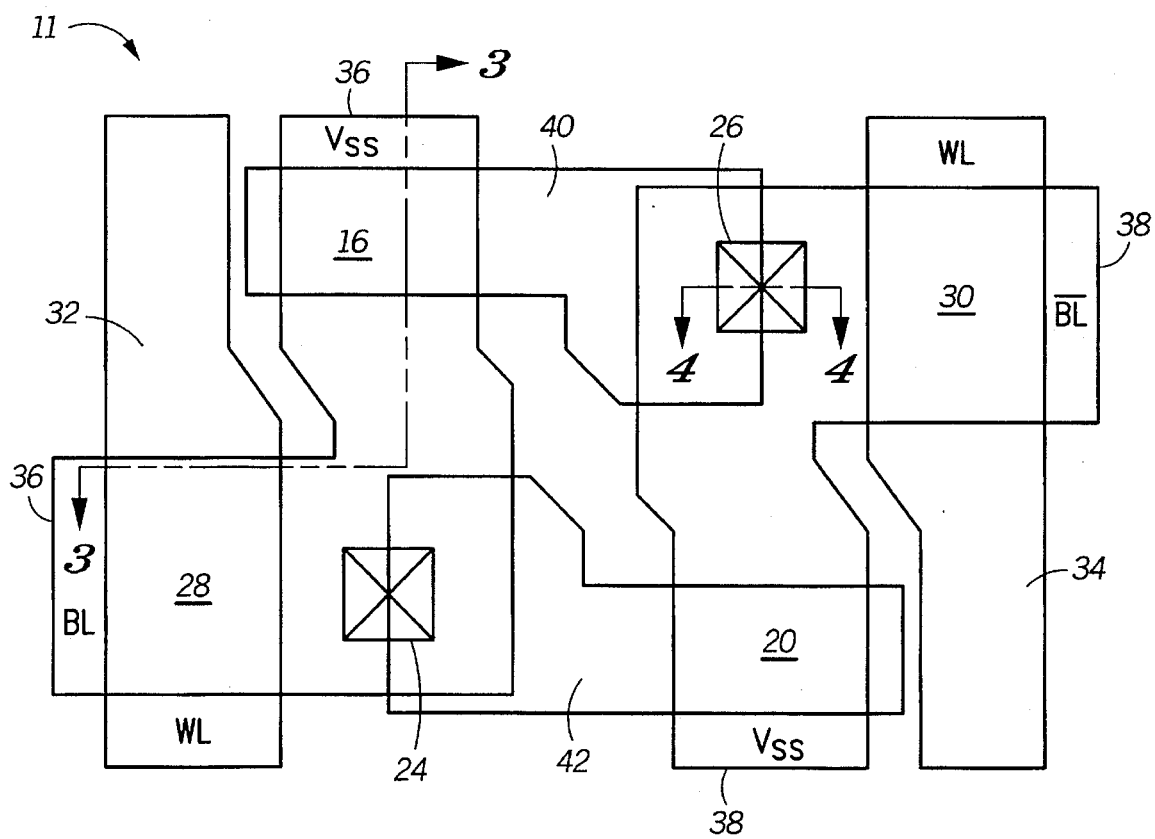
FIG. 2 illustrates, in plan view, one embodiment of the SRAM memory cell ranged in accordance with the invention.
Figure 3:
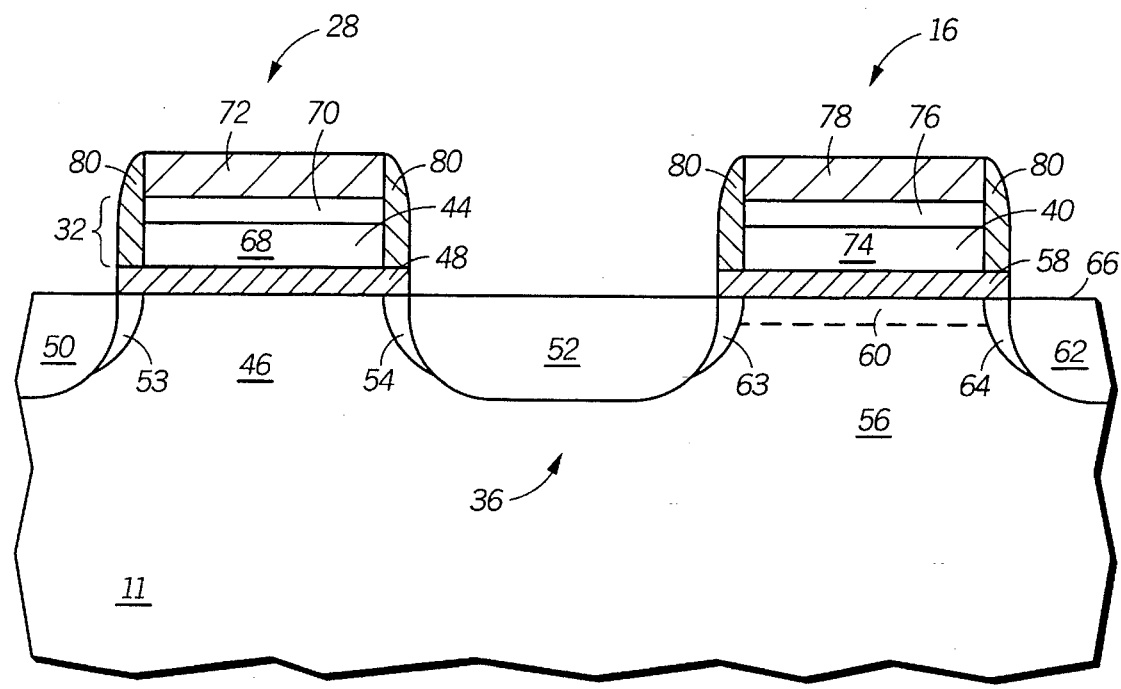
FIG. 3 illustrates in cross-section, a portion of the memory cell shown in FIG. 2 taken along section lines 3—3.

Shown in FIG. 3 is a cross sectional view of the memory cell shown in FIG. 2, taken along section line 3—3. Pass transistor 28 and driver transistor 16 are shown in cross-sectional view through active region 36. A portion of wordline 32 overlying active region 36 functions as a pass gate electrode 44. Pass gate electrode 44 is separated from a channel region 46 by a gate dielectric layer 48. Channel region 46 lies intermediate to a source region 50 and a drain region 52. In a preferred embodiment, lightly doped source and drain regions 53 and 54, respectively, are formed adjacent to either side of channel region 46.

Driver gate electrode 40 overlies a buried channel region 56 and is separated therefrom by a gate dielectric layer 58. Buried channel region 56 includes a channel surface layer 60 lying intermediate to drain region 52 and a source region 62. Lightly doped source and drain regions 64 and 63, respectively, are formed adjacent to and on either side of buried channel region 56. Pass transistor 28 and driver transistor 16 are electrically coupled by drain region 52. A bit-line contact (designated BL in FIG. 2) is formed to couple a bit-line signal with source region 50 of pass transistor 28. Correspondingly, a $V_{SS}$ signal is electrically coupled to source region 62 by means of a $V_{SS}$ contact (designated $V_{SS}$ in FIG. 2).

A current gain differential between pass transistor 28 and driver transistor 16 is created through the electrical coupling of a surface channel device with a buried channel device. Channel surface layer 60, in buried channel region 56, reduces the transverse electric field that charge carriers experience in channel region 56. The reduced transverse field permits a higher concentration of charge carriers in the channel region leading to high carrier mobility. For example, buried channel devices are known to have 20 to 40% higher mobility than conventional surface channel devices. The greater mobility provides higher current gain in the buried channel device than in a conventional surface channel device of comparable dimensions and doping concentrations.

Channel regions 46 and 56 are preferably formed by doping separate regions of substrate 11 with dopant species of opposite conductivity type. Preferably, a silicon dioxide layer is thermally grown to overlie surface 66. Then, a thin layer of polycrystalline silicon is deposited to overlie the silicon dioxide layer. The layer of polycrystalline silicon is of a minimal thickness, such that dopant species can be implanted through the polycrystalline silicon and the silicon dioxide layer and to penetrate into substrate 11. Next, a photolithographic mask is defined on the surface of the thin polycrystalline silicon layer to expose a portion of substrate 11 to be ion implanted. Preferably, channel region 46 is formed by the ion implantation of boron into substrate 11 using an ion implantation dose of about $1.0 \times 10^{12}$ to $3.0 \times 10^{12}$ ions/cm$^2$. Alternatively, indium can be ion implanted into substrate 11 to form channel region 46. Then, a second photolithographic mask is formed to expose a second portion of substrate 11 and an n-type dopant such as arsenic or antimony is implanted into substrate 11 to form channel surface layer 60. Preferably, arsenic is implanted to a dose of about $1.0 \times 10^{12}$ to $3.0 \times 10^{12}$ ions/cm$^2$ at an implantation energy of about 180 to 200 keV. Once the implantation process is complete, the photolithographic material is removed from the surface of the thin polycrystalline silicon layer and processing continues to form gate electrodes 40 and 44.

The preferred method for forming channel regions 46 and 56 avoids the direct contact of a photoresist layer and substrate surface 66. By providing a polycrystalline silicon layer overlying substrate 11 prior to the formation of a photolithographic mask, any contaminants present in the photolithographic material will not diffuse into substrate 11. To achieve the current gain differential of the present invention, it is important that the threshold voltage of pass transistors and driver transistors be carefully controlled to within the range of about 0.7 to 1.0 volts. Although the preferred embodiment includes the deposition of a polycrystalline silicon layer and an ion implantation process, other methods, such as solid state diffusion, and the like, can be used to form channel regions 46 and 56.

Preferably, pass gate electrode 44 and driver gate electrode 40 are fabricated by first depositing a layer of polycrystalline silicon to overlie substrate 11. A photolithographic mask is defined on the surface of the polycrystalline silicon layer, and an ion implantation process is carried out to dope a portion of the polycrystalline silicon layer with a conductivity-determining impurity. A subsequent photomasking and ion implantation process can be carried out to dope other regions of the polycrystalline silicon layer with an impurity imparting an opposite conductivity type to the polycrystalline silicon. In an optional processing step, after the polycrystalline silicon is doped, a refractory metal silicide layer can be deposited to overlie the polycrystalline silicon. Where a refractory metal silicide layer is used, preferably a layer of tungsten silicide is deposited onto the surface of the polycrystalline silicon layer. An insulating layer is sequentially deposited to overlie the polycrystalline silicon. Then, a photolithographic and reactive ion etching process are carried out to form driver gate electrode 40 and pass gate electrode 44.

Pass gate electrode 44 includes an n-type polycrystalline silicon layer 68, a tungsten silicide layer 70 and an insulating cap 72. Driver gate electrode 40 includes a p-type polycrystalline silicon layer 74, a tungsten silicide layer 76, and an insulating cap 78. Once the etching process forming the stacked gate structures for gate electrodes 40 and 44 is complete, an ion implantation process is carried out to form lightly doped source and drain regions 53, 54, 63, and 64. Preferably, an n-type dopant, such as arsenic or phosphorous, is used to impart n-type conductivity to the lightly doped source and drain regions. In a preferred embodiment, phosphorus is implanted to a dose of about $1.0 \times 10^{12}$ to $5.0 \times 10^{14}$ ions /cm$^2$ at an implant energy of about 20 to 50 keV. Next, an insulating layer, such as silicon nitride, is deposited to overlie the surface of substrate 11, and a reactive ion etching process is carried out to form sidewall spacers 80 adjacent to gate electrodes 40 and 44. Then, a second ion implantation process is performed to form n-type source and drain regions 50, 52, and 62. Preferably, an n-type dopant, such as phosphorus or arsenic, is implanted to a dose of about $1.0 \times 10^{15}$ to $1.0 \times 10^{16}$ ions/cm$^2$ at an implantation energy of about 20 to 50 keV.

During the formation of the gate electrodes, various thermal processing steps carried out to reoxidize the substrate surface and to activate dopants in the substrate. It is known that n-type polycrystalline silicon oxidizes more rapidly than p-type polysilicon. The differential oxidation rate of n-type and p-type polycrystalline silicon advantageously assists in providing a greater current gain in the driver transistor 16 relative to pass transistor 28. This is because more lateral oxidation takes place at the interface between n-type polycrystalline silicon layer 68 and gate dielectric layer 48, than at the corresponding interface between p-type polycrystalline layer 74 and gate dielectric layer 58. The enhanced "bird's beak" under polycrystalline silicon layer 68 (not shown) slightly reduces the current gain in pass transistor 28.

As previously described, the fabrication of driver transistor 16 as a buried channel device and electrically coupling the driver transistor to a pass transistor operating as a surface channel device, provides a current gain differential. Driver transistor 16 functions as a normally-off buried channel device. Driver gate electrode 40 contains a concentration of p-type dopant sufficient to create a suitably large workfunction such that channel surface layer 60 is depleted of n-type of carriers. The large work-function difference between driver gate electrode 40 and channel surface layer 60 produces normally-off transistor characteristics in the absence of applied voltages. When the device is turned on, current is conductive below the surface, where both mobility is larger than surface mobility.

Figure 4:
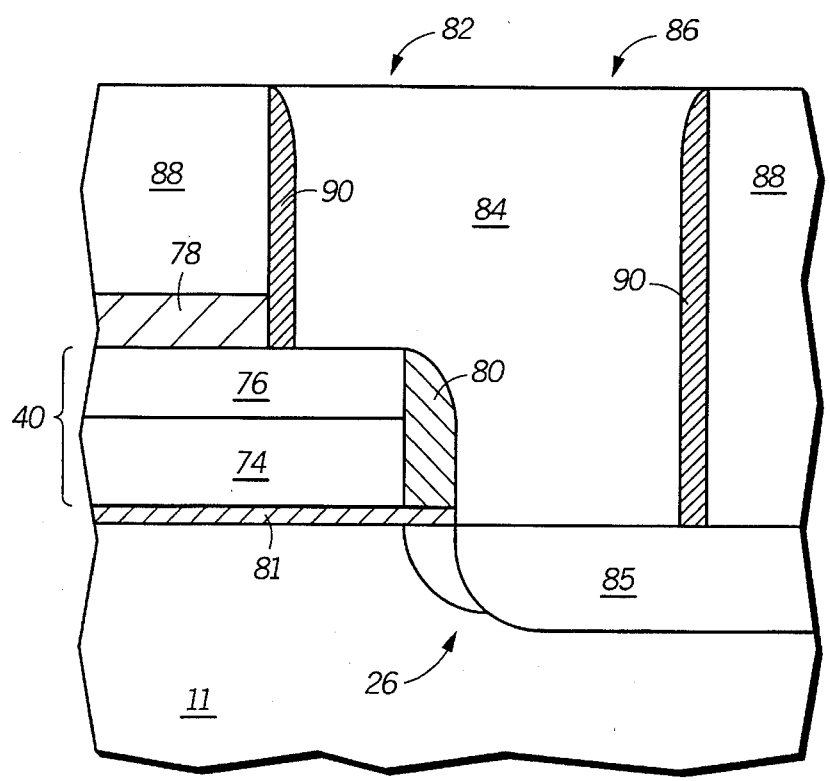
FIG. 4 illustrates in cross-section, a portion of the SRAM cell shown in FIG. 2, taken along section 4—4.

The fabrication of a memory cell, such as an SRAM memory cell, requires that the driver gate electrode be electrically coupled to cell nodes, such as nodes 24 and 26 shown in FIGS. 1 and 2. To avoid the formation of a diode when the p-type driver gate electrodes are coupled to n-type substrate regions, a metallized shared contact structure can be employed. FIG. 4 illustrates, in cross-section, a portion of node 26 showing the detailed construction of a shared contact 82. The cross-sectional view illustrates node 26 after additional processing steps are carried out to form an insulating layer overlying the structure shown in FIG. 2. A portion of insulating layer 78 is etched away to expose a portion of tungsten silicide layer 76. A refractory metal plug 84 contacts both tungsten silicide region 76 of driver gate electrode 40 and an n-type doped region 85. Metal plug 84 is contained within an opening 86 formed in an insulator 88. The walls of opening 86 are optionally lined with a silicon nitride layer 90. Preferably, metal plug 84 is formed by the deposition of a refractory metal such as tungsten, and the like, followed by a planarization process. In order to improve the adhesion of the tungsten metal to substrate 11, a titanium nitride layer, or a composite titanium nitride/titanium layer (not shown) can be included to improve the adherence of metal plug 84 to substrate 11. Accordingly, shared contact 82 provides a means for coupling driver gate electrode 40 to substrate 11 and avoids the formation of an undesired diode.

Thus it is apparent that there has been provided, in accordance with the invention, a semiconductor device having a buried channel transistor, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the SRAM cell can include resistors in the place of load transistors, and can include additional structure, such as capacitors, and the like. Furthermore, the buried channel device can be coupled to the surface channel device by a conductive or semiconductive layer overlying the surface of the substrate. It is therefore intended to include within the invention all such variations and modifications as fall within the scope of the appended claims and equivalents thereof.

We claim:

1. A semiconductor device including an SRAM cell having a driver transistor coupled to a pass transistor in which the current gain of the driver transistor is greater than the current gain of the pass transistor comprising:

a substrate of a first conductivity type having a surface;

the pass transistor having a first gate electrode of a second conductivity type, wherein the pass transistor is characterized by a first current gain;

the driver transistor electrically coupled to the pass transistor, the driver transistor having a second gate electrode of the first conductivity type and having a channel surface layer of the second conductivity type, wherein the driver transistor is characterized by a second current gain, wherein the second current gain of the driver transistor is greater than the first current gain of the pass transistor;

a first substrate region of the second conductivity type; and a metal region contacting the second gate electrode and electrically coupling the second gate electrode to the first substrate region.

2. The semiconductor device of claim 1 further comprising a second substrate region of the second conductivity type in the substrate intermediate to the first and second gate electrodes electrically coupling the pass transistor to the driver transistor.

3. The semiconductor device of claim 1 further comprising a refractory metal silicide region residing in the second gate electrode and contacting the metal region.

4. A semiconductor device including an SRAM memory cell having a driver transistor coupled to a pass transistor in which the current gain of the driver transistor is greater than the current gain of the pass transistor comprising:

a substrate having a surface and having first and second active regions therein;

first and second channel regions in the first active region of the substrate separated by a first N-type doped region, wherein the first channel region is characterized by a first transverse electric field, and wherein the second channel region is characterized by a second transverse electric field;

an N-type gate electrode overlying the first channel region and separated therefrom by a first dielectric layer;

a P-type gate electrode overlying the second channel region and separated therefrom by a second dielectric layer, wherein a portion of the P-type gate electrode overlies the second active region;

a second N-type doped region extending from the substrate surface into the second channel region, wherein the second N-type doped region reduces the second transverse electric field in the second channel region, whereby the electron mobility in the second channel region is greater than the electron mobility in the first channel region; and a metal region coupling the P-type gate electrode to the second active region.

5. The semiconductor device of claim 4, wherein the first channel region and the second channel region are associated with the pass transistor and the driver transistor, respectively, of the SRAM memory cell, and wherein the first N-type doped region is a common drain region.

6. The semiconductor device of claim 4 further comprising a first refractory metal silicide region overlying the N-type gate electrode and a second refractory metal silicide region overlying the P-type gate electrode.

7. A semiconductor device including an SRAM cell having a driver transistor coupled to a pass transistor in which the current gain of the driver transistor is greater than the current gain of the pass transistor comprising:

a substrate having a first active region therein;

a second active region in the substrate separated from the first active region by an insulation region;

a first gate electrode of a first conductivity type overlying a first channel region in the first active region and separated therefrom by a first dielectric layer;

a buried channel region of the first conductivity type in the first active region;

a second gate electrode of a second conductivity type overlying the buried channel region and separated therefrom by a second dielectric layer;

a doped region of the first conductivity type in the first active region intermediate to the first channel region and the buried channel region;

a metal layer contacting a portion of the second gate electrode and electrically coupling the second gate electrode to the second active region.

8. The semiconductor device of claim 7 further comprising a refractory metal silicide region overlying the second gate electrode and contacting the metal layer.

\* \* \* \* \*